US005617325A

United States Patent [19]
Schaefer

[11] Patent Number: 5,617,325
[45] Date of Patent: Apr. 1, 1997

[54] METHOD FOR ESTIMATING INTERCONNECT DELAYS IN INTEGRATED CIRCUITS

[75] Inventor: Thomas J. Schaefer, Cupertino, Calif.

[73] Assignee: VLSI Technology, Inc., San Jose, Calif.

[21] Appl. No.: 941,763

[22] Filed: Sep. 4, 1992

Related U.S. Application Data

[63] Continuation of Ser. No. 542,382, Jun. 22, 1990, abandoned.

[51] Int. Cl.⁶ ................................................. G06F 17/50
[52] U.S. Cl. ............................................ 364/488; 364/578
[58] Field of Search .................................... 364/488, 489, 364/490, 578, 802; 371/23

[56] References Cited

U.S. PATENT DOCUMENTS

| | | | |
|---|---|---|---|
| 4,698,760 | 10/1987 | Lembach et al. | 364/488 |
| 4,728,428 | 5/1989 | Dunlop et al. | 364/488 |
| 4,744,084 | 5/1988 | Beck et al. | 364/578 |
| 4,924,430 | 5/1990 | Zasio et al. | 364/578 |
| 4,961,156 | 10/1990 | Takasaki | 364/578 |
| 4,965,758 | 10/1990 | Sherman | 364/488 |
| 5,003,487 | 3/1991 | Drumm et al. | 364/488 |

OTHER PUBLICATIONS

"Signal Delay in General RC Networks w/ Application to Timing Simulation of Digital ICs"; Lin et al.; 1984 Conf. on Advanced Research in VLSI Excl: A Circuit Extractor for Ic Designs; McCormick; 21ˢᵗ Design Automation Conf. (IEEE) 1984 pp. 616–623.

"Signal Delay in RC Tree Networks"; Rubinstein et al.; IEEE Trans Computer–Aided Design (V.C.AD–2, No. 3) Jul. 1983; pp. 202–210.

"Switch Level Delay Models for Digital Mos VLSI"; Ousterhout; IEEE 21ˢᵗ Design Automation Conf., 1984; pp. 542–548.

J.L. Wyatt, Jr., "Signal Propagation Delay in RC Models for Interconnect", *Circuit Analysis, Simulation and Design*, 2 ed., A.E. Ruehli, Elsevier, 1987, pp. 254–291.

J. Rubinstein et al, "Signal Delay in RC Tree Networks", *IEEE Transactions on Computer–Aided Design*, 2 (1983), pp. 202–211.

J.L. Wyatt, Jr., "Signal Delay in RC Mesh Networks", *IEEE Transactions on Circuits Systems*, 32 (1985), pp. 507–510.

C.A. Zukowski, "Relaxing Bounds for Linear RC Mesh Circuits", *IEEE Transactions on Computer–Aided Design*, 5 (1986), pp. 305–312.

P.K. Chan et al, "Bounds on Signal Delay in RC Mesh Networks", *IEEE Transactions on Computer–Aided Design* 8 (1989), PP. 581–589.

M.A. Horowitz, "Timing Models for MOS Pass Networks", *International Symposium on Circuits and Systems*, pp. 198–201 IEEE, 1983.

L.M. Brocco et al, "Macromodeling CMOS Circuits for Timing Simulation", *IEEE Transactions on Computer–Aided Design*, 7 (1989), pp. 1237–1249.

M.A. Horowitz, "Timing Models for MOS Circuits", Ph.D. Thesis, Stanford University, 1983.

*Primary Examiner*—Vincent N. Trans
*Attorney, Agent, or Firm*—Burns, Doane, Swecker & Mathis, LLP

[57] ABSTRACT

A method for predicting circuit interconnect delays in circuits of the type that have a driving device attached to an input node of a network having a plurality of nodes, with the driving device changing states from time to time so as to impose on the network a voltage different from the previous voltage of the network. The method includes the steps of estimating the waveform on the input node and predicting the waveforms on other nodes of the network on the basis of the estimated input node waveform.

24 Claims, 3 Drawing Sheets

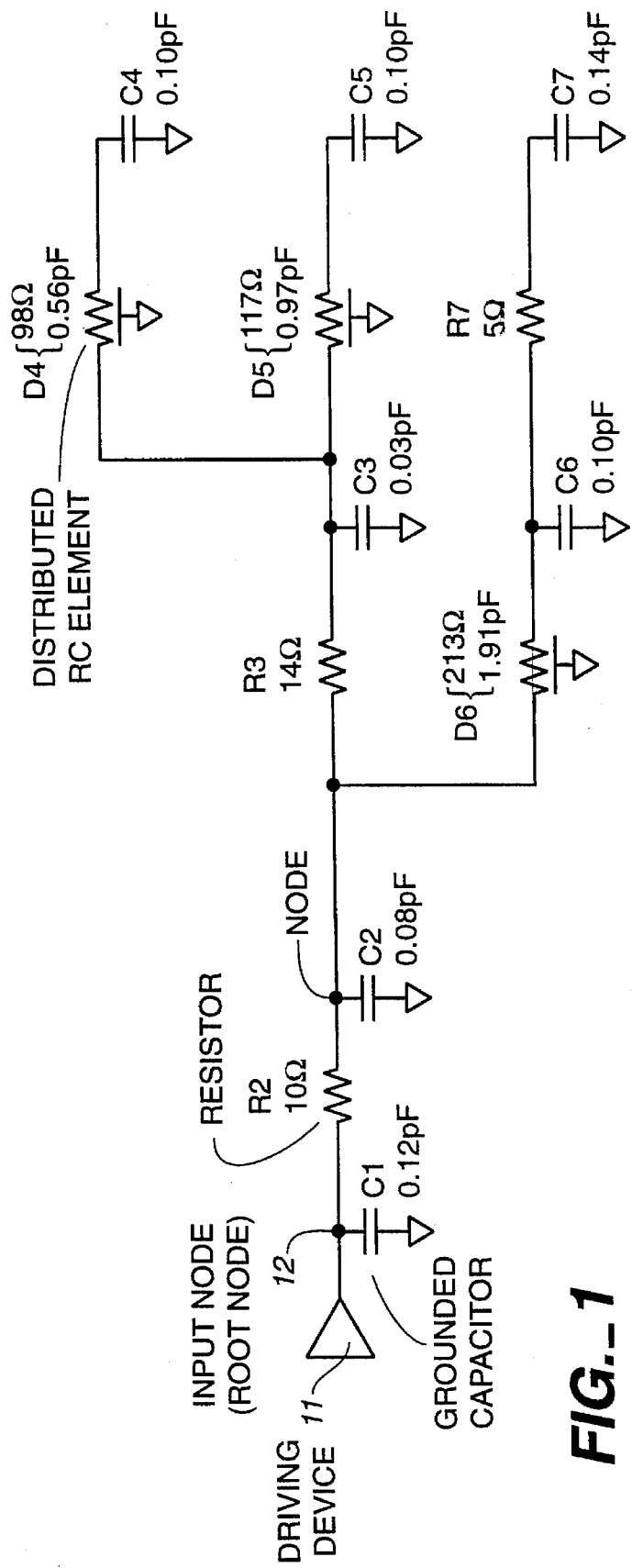
FIG._1

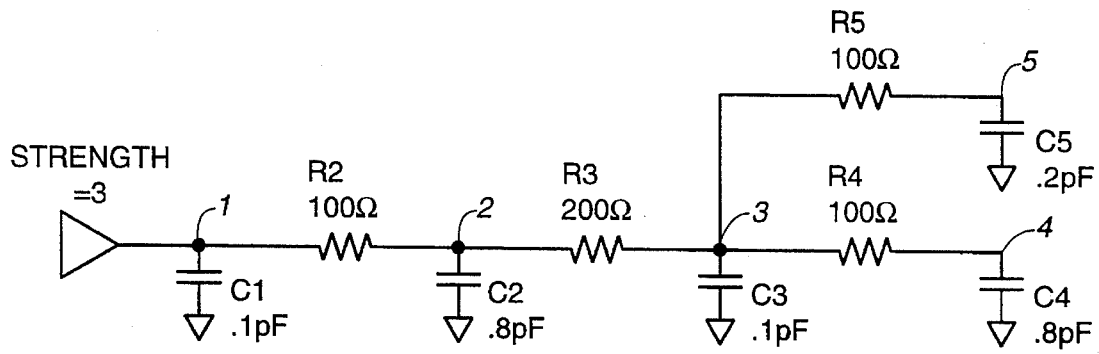
FIG._2
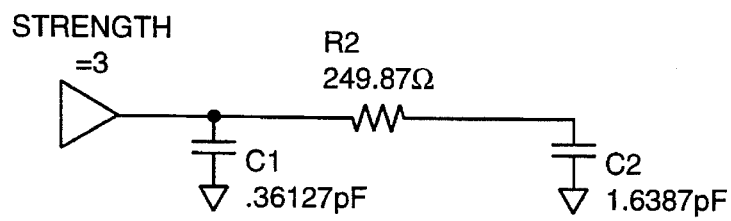
FIG._3
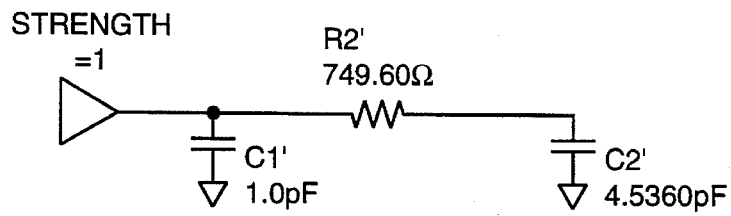
($xo = 1$, $c\emptyset = 1.0pF$)
FIG._4

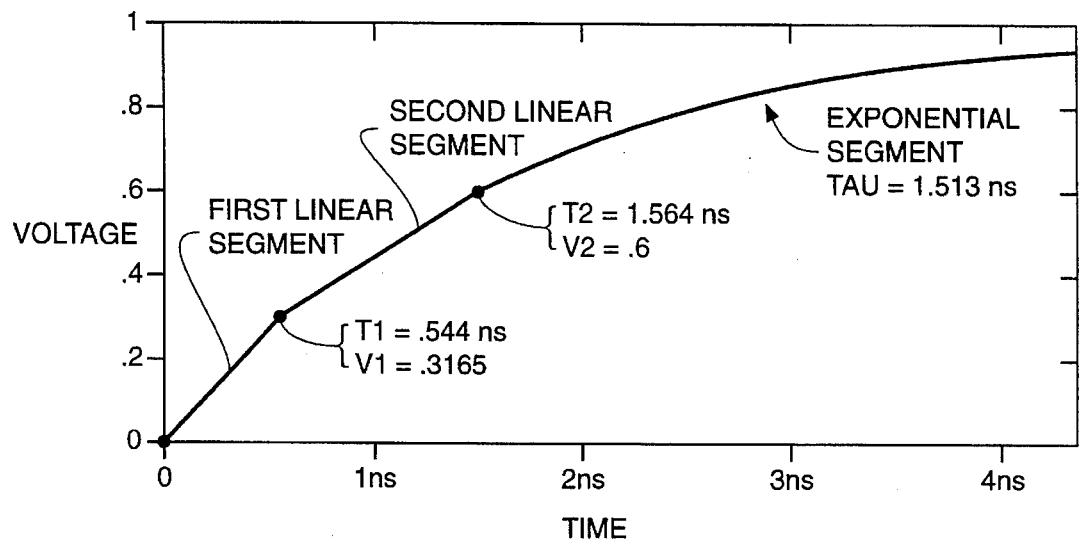
FIG._5
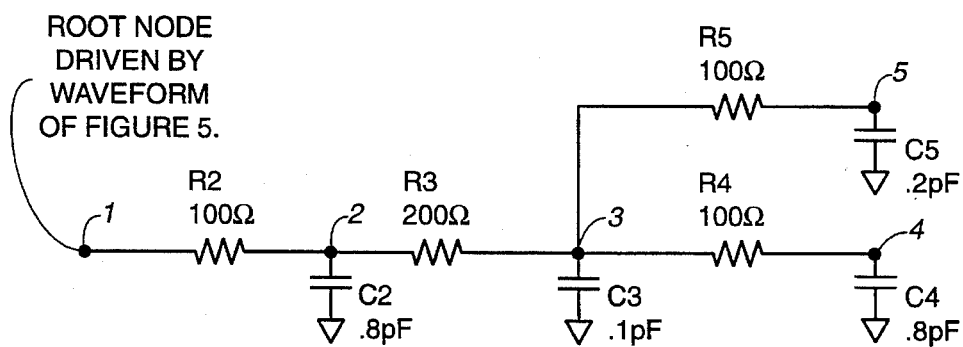
FIG._6

METHOD FOR ESTIMATING INTERCONNECT DELAYS IN INTEGRATED CIRCUITS

This application is a continuation, of application Ser. No. 07/542,382, filed Jun. 22, 1990 now abandoned.

BACKGROUND OF THE INVENTION

1. Field of the Invention

The present invention generally relates to methods for determining signal delays in integrated circuits and, more particularly, to methods for determining signal delays in integrated circuits where the delays are due to the resistance of interconnecting wires.

2. State of the Art

During the design of integrated circuits, it is often necessary for design engineers to determine signal delays within the circuits. Although the signal delays could be determined by testing prototype circuits, integrated circuits are expensive and time consuming to fabricate in limited quantities. Accordingly, it is highly desirable to determine signal delays within integrated circuits by mathematical modeling techniques.

Signal delays in integrated circuits arise from various factors, including the resistance of wires that connect elements within the circuits. In fact, wire resistance becomes an increasingly significant factor in causing delays as integrated circuits become denser (i.e., contain increased numbers of elements per unit area) and as wire widths become narrower. In practice, however, it is difficult to calculate signal delays caused by wire resistances. Moreover, to be of practical use to circuit designers, the computational technique must be capable of computing all interconnect delays in integrated circuits having on the order of 100,000 or more transistors on a desk-top work station within a time frame on the order of, for example, one hour or less.

In practice, computer-based simulations of integrated circuits are often used for estimating signal delays. In one common method of circuit simulation, a computer program is used for numerically solving a system of non-linear differential equations derived from the state equations that describe the components of an integrated circuit undergoing design. However, this type of simulation program requires too much computational time and data storage capacity to be suitable for routine analysis of most integrated circuits of the LSI and VLSI class.

A technique called "macro-modelling" has also been used for simulating LSI and VLSI integrated circuits. In the macro-modeling technique, an integrated circuit is modelled as a number of "standard" blocks (i.e., macro-cells), whose electrical characteristics have been pre-characterized (usually, by circuit simulation). For example, one of the blocks in a macro-modelled circuit might be a NAND gate, and the pre-characterization of that block might provide a simple rule for calculating the delay at the gate output as a function of the capacitance being driven and the signals arriving at gate input pins. Then, using the predetermined rule, a logic simulator or timing verifier can predict the delay through the NAND gate in a macro-modelled integrated circuit. However, in conventional practice, such logic simulators do not account for the resistance of interconnecting wires in simulated circuits.

SUMMARY OF THE INVENTION

Generally speaking, the present invention provides a method for predicting circuit interconnect delays in integrated circuits. More particularly, the present invention provides a method for predicting delays within a single interconnect net of an integrated circuit. Each such interconnect net is a circuit consisting of a driving device attached to an input node (or "root" node) of a network having a plurality of nodes, with the driving device changing states from time to time so as to impose on the network a voltage different from the previous voltage of the network. In preferred practice, a method according to the present invention includes the steps of estimating the waveform on the input node and predicting the waveforms on other nodes of the network on the basis of the estimated input node waveform.

The two above-mentioned steps are performed for each interconnect net of the integrated circuit. Moreover, for nets that have more than one driving device, these two steps are performed with respect to the input node corresponding to each driving device. Thus, the method of the present invention separates the delay estimation problem into two sub-problems having distinct computational characteristics. Once the first step is completed (i.e., the input node waveform is known), the second step involves completely linear analysis; i.e., analyzing a linear RC circuit forced by a given voltage waveform on the input node. The second step can therefore take advantage of known methods for analyzing linear circuits.

BRIEF DESCRIPTION OF THE DRAWINGS

The present invention can be further understood by reference to the following description and the appended drawings which illustrate the preferred embodiments of the invention. For purposes of description, identical components are given the same reference numerals in the various drawing figures. In the drawings:

FIG. 1 shows an example of a circuit comprising an RC tree;

FIG. 2 shows another example of an RC tree;

FIG. 3 shows a reduced (i.e., simplified) circuit of the FIG. 2 circuit;

FIG. 4 shows a scaled reduced driver circuit of the FIG. 3 circuit;

FIG. 5 shows a piecewise approximation of the FIG. 4 root node waveform; and

FIG. 6 shows an exemplary load circuit.

DETAILED DESCRIPTION OF PREFERRED EMBODIMENTS

In FIG. 1, a driving device 11 is connected to the input node 12 of a circuit comprising interconnect wires in a resistive-capacitive network (i.e., RC net). Generally speaking, an RC net can be considered to be a set of nodes joined by linear resistors and distributed linear resistive-capacitive elements, with each node in the net having a linear capacitance with respect to a fixed reference ("ground") voltage.

In the following, some nodes of RC nets are identified as "target nodes". This designation denotes that such nodes are ones whereat delays are to be computed. In practice, target nodes usually are input pins of other macro-cells or primary outputs of an integrated circuit under consideration.

It should be noted that the RC net in FIG. 1 actually is an RC "tree," i.e., an RC net without loops. Because most RC nets encountered in practice are RC trees, there usually is a unique path from an input node to any other node in an RC net under consideration. Thus, in the following, it will be initially assumed that the RC net is a tree and has only one driving device, hence, has a unique root node.

Transitions of RC nets between discrete voltage levels can be described as follows: Initially, an entire net can be considered to have some constant voltage $V_0$. At some time, the driving device instantaneously starts driving the net toward a final voltage $V_1$. As the RC net converges to the voltage $V_1$, the voltage on any given node in the net changes gradually from $V_0$ to $V_1$. The function that describes the voltage on the node over time is called the "output waveform" of that node.

For convenience, it will be assumed that voltages are expressed according to a scale in which the number "0" corresponds to $V_0$ volts and the number "1" corresponds to $V_1$ volts. Thus, voltage values will be expressed in "voltage units" that are related to actual voltage (i.e., volts) by the formula $V_V = V_0 + V_U (V_1 - V_0)$, where $V_V$ is the voltage in volts and $V_U$ is the voltage in the "voltage units".

In practice, a given technology can include a number of different driver devices. For example, in CMOS technology, there are two fundamental kinds of device: n-channel transistors and p-channel transistors. Each different kind of device will be referred to as a "device family". Within each family, devices come in a variety of sizes, but can be assumed to share certain electrical characteristics.

For a given device family, there usually are a finite number of different combinations of a starting voltage and a final voltage that need to be analyzed. For example, in CMOS logic circuits, there are two principal voltage values which occur, often referred to as $V_{SS}$ and $V_{DD}$, or "logic low" and "logic high". In such circuits, n-channel transistors are commonly used only to drive nets from $V_{DD}$ to $V_{SS}$, and p-channel transistors are used only to drive nets from $V_{SS}$ to $V_{DD}$.

For example, to apply this method to CMOS logic circuits requires just two calibration ensembles (i.e., two combinations, each consisting of a device family, a starting voltage, and a final voltage). The first ensemble consists of n-channel devices driving from the logic-high voltage to the logic-low voltage. The second ensemble consists of p-channel devices that drive from the logic-low voltage to the logic-high voltage.

In practice, it can also be assumed that when a grounded linear capacitor with no resistance is driven by a driving device, the time taken by the output of the driving device to reach any fixed voltage is proportional to the capacitance of the capacitor. For example, if a capacitance of 1 pF (picofarad) is connected to the output of a driving device and if the driving device requires 2 ns (nanoseconds) to drive its output voltage to 0.75, then the driving device will take 3 ns to drive its output to the same voltage when loaded with a 1.5 pF capacitance.

Also in practice, it can also be assumed that each driving device has a "strength" that can be represented by a real number "S". (Alternatively, each driving device can be characterized by a real number impedance, in which case the strength of a driving device can be understood to be the reciprocal of its impedance). When two driving devices of the same device family with differing strengths drive identical capacitances with the same starting and final voltages, it can be assumed that the voltage waveforms at the outputs of those two devices are identical except that the time scales for the respective waveforms are inversely proportional to the strengths of the two driving devices. For example, if a driving device having strength S=1 drives a 1 pF linear capacitance such that the output voltage reaches a value of 0.75 in 1 ns, then a driving device having strength S=2 would require 0.5 ns to drive the same load to the same voltage.

Generally speaking, the below-described method for predicting circuit interconnect delays in integrated circuit designs comprises two steps that are done for each net of the circuit and for each driving device of each such net. The two steps can be summarized as: 1) estimating the waveform on the root node; and 2) using the estimated root-node waveform to calculate the waveforms on all other target nodes in the net. Both steps normally include sub-steps. A first sub-step, for example, of the first step normally comprises reducing any driver circuit (i.e., driver device with attached RC net) to a simplified circuit (a "reduced driver circuit") comprised of the original driving device and one linear resistor. This sub-step serves the purpose of reducing the number of parameters so that table look-up methods can be applied. An example of a non-reduced driver circuit is shown in FIG. 2, and a corresponding reduced driver circuit is shown in FIG. 3.

For purposes of explanation of FIG. 3, the parameters of the reduced circuit are as follows: the capacitor at the root node has capacitance $C_1$, the resistor at the root node has resistance $R_2$, and the node at the end of the resistor has capacitance $C_2$. In practice, the values $C_1$, $R_2$, and $C_2$ are selected such that the waveform on the root node of the reduced circuit approximates the waveform on the root node of the original circuit. That is, the values $C_1$, $R_2$ and $C_2$ of the circuit of FIG. 3 are selected so that the root-node response of the reduced driver circuit approximates the root-node response of the original circuit of FIG. 2. Methods for selecting those resistance and capacitance values will be described below.

A second sub-step will now be described for further reducing the number of parameters and, thereby, further facilitating the use of table look-up methods. The second sub-step comprises producing a "scaled reduced driver circuit". In practice, this sub-step is accomplished by scaling resistance and capacitance values in the reduced driver circuit. In the preferred embodiment, the resistance values (including driver strength) of the reduced driver circuit are scaled so that, after scaling, the driver of the scaled circuit has a fixed strength $X_o$, and the capacitance values of the reduced circuit are scaled so that, after scaling, the root node of the scaled circuit has a fixed capacitance $C_o$. For purposes of discussion, the fixed driver strength $X_o$ and fixed capacitance $C_o$, respectively, are referred to as the "calibration strength" and the "calibration capacitance", respectively. In practice, it is convenient to describe the scaling by the following set of equations:

$$X_1' = X_o$$

$$C_1' = C_o$$

$$R_2' = R_2 (X_1/X_o) \text{ and}$$

$$C_2' = C_2 (C_o/C_1).$$

In the preceding set of equations, the symbol $X_1$ designates the strength of the driving device of the original circuit, and the symbols $X_1'$, $C_1'$, $R_2'$, $C_2'$ designate the parameters of the scaled reduced driver circuit. A scaled reduced driver circuit is shown in FIG. 4, and the illustrated circuit is shown having parameter values $R_2'$ and $C_2'$ that are computed in accordance with the preceding set of equations.

It can now be understood that signal delays in the scaled reduced driver circuit of FIG. 4 can be related to the delays of the reduced driver circuit of FIG. 3. More particularly, by using the above-listed assumptions, the signal delay in the scaled circuit of FIG. 4 providing any given output voltage is equal to $(X_1/X_0)$ $(C_0/C_1)$ times the delay required for the reduced driver circuit of FIG. 3 to provide the same output voltage.

In the preferred embodiment, look-up tables are employed to find the waveform on the root node in the scaled reduced driver circuit. More particularly, a two-dimensional look-up table is used for each voltage level for which a signal delay at a root-node is to be predicted. Such tables provide the delay to the given voltage as a function of $R_2'$ and $C_2'$. (For values of $R_2'$ and $C_2'$ between the tabulated values, interpolation is used.) In practice, the look-up tables are constructed by using circuit simulation programs as described above. Thus, construction of look-up tables consists of doing circuit simulations for a large number of circuits of the form shown in FIG. 4, with varying values of $R_2'$ and $C_2'$. The circuit simulations could, for example, range over fifteen values of $R_2'$ and twelve values of $C_2'$, for a total of one hundred-eighty (180) circuit simulations.

For purposes of discussion, the process of constructing look-up tables for one calibration ensemble can be called a "calibration." In practice, one calibration is employed for each calibration ensemble. Accordingly, for CMOS logic circuits, two calibrations are required: one for the $V_{SS}$ to $V_{DD}$ transition and one for the $V_{DD}$ to $V_{SS}$ transition. It should be understood that the simulated circuits used in a given calibration all have the same driver strength $(X_0)$ and root node capacitance $(C_0)$, which are the same values referred to in the second sub-step above. But different calibration ensembles can use different values of $X_0$ and $C_0$. Thus look-up tables can be constructed by a program that extracts necessary information from the results of circuit simulations.

As discussed above in conjunction with FIG. 3, each delay in the scaled reduced driver circuit is equal to the corresponding delay in the reduced driver circuit multiplied by a scaling factor of $(X_1/X_0)$ $(C_0/C_1)$. Accordingly, each delay obtained from a look-up table is divided by this scaling factor. The resulting set of numbers are delay estimates for the root node of the reduced driver circuit, and are also delay estimates for the root node of the original circuit (e.g., the circuit of FIG. 2).

FIG. 5 shows an example of an estimated root-node waveform for the circuits of FIGS. 2 through 4. The illustrated root-node waveform consists of two linear segments followed by a final exponential segment. The first linear segment goes from voltage 0 at time 0 to a voltage $V_1$ (e.g., 0.3165) at time $T_1$. The second linear segment goes from voltage $V_1$ at time $T_1$ to a voltage $V_2$ (e.g., 0.6) at time $T_2$. The exponential segment starts at voltage $V_2$ at time $T_2$ and asymptotically approaches voltage 1 with time constant T. Thus, the root-node waveform is completely described by five real numbers (i.e., $T_1$, $V_1$, $T_2$, $V_2$ and $\tau$).

In general, a 3-piece root node waveform such as shown in FIG. 4 can be generated by selecting constant values for $V_1$ and $V_2$ (e.g., $V_1$=0.3165 volts and $V_2$=0.6 volts) and, then, obtaining values for $T_1$, $T_2$, and $\tau$ from look-up tables.

In conjunction with FIG. 6, the second step of the preferred method will now described. It should be understood that this second step is performed using the original circuit without the driving device but with the root-node waveform obtained in the first step. The term "load circuit" will be used to refer to such circuits, and the term "forced root-node waveform" will be used to refer to the waveform obtained in the first step.

The second step can be implemented by various known methods for solving linear systems. In the preferred implementation, the second step includes three sub-steps which are performed for each target node. The first sub-step consists of approximating the load circuit by a system having a small number of time constants. Specifically, for each target node, a small number of time constants $\tau_1$, $\tau_2$, ..., $\tau_n$, and coefficients $A_1$, $A_2$, ..., $A_n$. are determined such that the step response of the target node is approximated by the expression:

$$V(t)=1-A_1 e^{-t/\tau_1}-A_2 e^{-t/\tau_2}- \ldots -A_n e^{-t/\tau_n}.$$

By definition, the "step response" of a target node is the waveform that would appear on the target node if a voltage step from the initial voltage to the final voltage were imposed on the root node at time t=0.

Once the time constants $\tau_1$, ..., $\tau_n$ and coefficients $A_1$, ..., $A_n$ have been determined, the response of the same system to any given forced root-node waveform can be determined analytically. The analysis can be based upon, for instance, convolution integrals and/or other standard integration techniques.

As a simplified example, it can be assumed that n=2 in the foregoing equation. In that case, values for the parameters $\tau_1$, $\tau_2$, $A_1$, $A_2$ are determined such that the step response of the target node is approximated by the expression:

$$V(t)=1-A_1 e^{-t/\tau_1}-A_2 e^{-t/\tau_2}.$$

Since the constraint V(O)=0 implies that $A_2$=1−$A_1$, only three parameters need to be determined: namely, $\tau_1$, $\tau_2$, and $A_1$. Thus, the first sub-step involves choosing values of those parameters to fit the particular target node.

Preferred methods for computing those parameters will now be discussed. In each of those methods, several significant time constants are computed for the linear circuit being estimated, and then parameters of the two-time-constant approximation are chosen.

The first exemplary method, herein referred to as "Three Moment Matching", comprises the steps of computing the first three moments of the impulse response of the target node, and then choosing the parameters $\tau_1$, $\tau_2$, and $A_1$ of the two-time-constant approximation so that it has the same values for its first three moments.

For convenience, the notation $MM_k(N)$ will be used to denote the k-th moment of the impulse response of node "N" divided by k factorial. Thus:

$MM_1(N)=MU_1(N)$,
$MM_2(N)=MU_2(N)/2$,
$MM_3(N)=MU_3(N)/6$.

In practice, the quantities $MM_1(N)$, $MM_2(N)$, and so forth are usually more convenient to work with than the moments themselves.

This method begins by computing the quantities $MM_1(N)$, $MM_2(N)$ and $MM_3(N)$ for all nodes N of the load circuit. If the load circuit does not contain any distributed RC elements, suitable formulae for computing these quantities are:

$$MM_1(N) = \sum_j R(j,N)C(j)$$

$$MM_2(N) = \sum_j R(j,N)C(j)MM_1(j)$$

$$MM_3(N) = \sum_j R(j,N)C(j)MM_2(j)$$

where the index "j" of the summations ranges over all nodes of the load circuit and the quantity R(j,N) is defined to be the sum of all resistances lying on the intersection of the path from the root node to node j with the path from the root node to node N. Methods for efficiently evaluating the above equations, including generalization to the case where distributed RC elements are present, are discussed for example, in "Timing Models for MOS Circuits" by M. A. Horowitz (Ph.D. Thesis, Stanford University, 1983), and "Signal Delay in RC Tree Networks" by J. Rubinstein, P. Penfield and M. A. Horowitz (I.E.E.E. Transactions on Computer-Aided Design, vol. CAD-2, 1983, pp. 202–211).

The parameters $\tau_1$, $\tau_2$ and $A_1$ can be computed by the following formulae:

$crit = MM_2(N) - MM_1(N)^2$ (if $crit=0$ use another method)

$b = [MM_3(N) - MM_1(N) \; MM_2(N)]/crit$ $c = b \; MM_1(N) - MM_2(N)$ $rtmp = b^2 - 4c$ (if $rtmp \leq 0$ use another method)

$rrsqrt = \sqrt{rtmp}$ $\tau_1 = 0.5 \; (b + rrsqrt)$ $\tau_2 = 0.5 \; (b - rrsqrt)$ (if $\tau_2 \leq 0$ use another method)

$A_1 = (MM_1(N) - \tau_2)/(\tau_1 - \tau_2)$

If the preceding formulas fail to give a result, a "Two Moment Matching" method can be used. Two Moment Matching is like three moment matching except that only the first two moments of the impulse response of node N are matched. Since the two-time-constant approximation has three parameters, one parameter can be chosen arbitrarily.

The following method depends on an arbitrary parameter "f" whose value can be based on empirical considerations. According to this method, values for $MM_1(N)$ and $MM_2(N)$ are computed for each node N, using the above formulae. Then, values for $\tau_1$, $\tau_2$ and $A_1$ are computed as follows:

$\tau_1 = f \; MM_2(N)/MM_1(N)$ $\tau_2 = (MM_2(N) - \tau_1 \; MM_1(N))/(MM_1(N) - \tau_1)$ $A_1 = (MM_1(N) - \tau_2)/(\tau_1 - \tau_2)$ Based on empirical results, the parameter "f" can be chosen as follows:

If $MM_2(N) < MM_1(N)^2$, let $f=0.4$; otherwise let $f=1.2$.

If $MM_2(N) < (MM_1(N))^2$, then any choice of the parameter "f" between 0 and 0.5 gives a solution with $\tau_2 > \tau_1 > 0$. Otherwise, for any choice of the parameter $f > 1$, the solution yields $\tau_1 > \tau_2 > 0$.

In the case where $MM_2(N) = (MM_1(N))^2$, it can be shown that any two-time-constant system whose first two moments satisfy this equation must have its third moment given by $MM_3(N) = MM_1(N)^3$. Since these relations hold for a simple exponential, this case can be solved with a one-time-constant approximation. In practice, this is done by setting $\tau_1 = MM_1(N)$ and $A_1 = 1$, so that the two-time-constant approximation is a simple exponential with one time constant. A preferred implementation uses this "one-time-constant" approximation when MM2(N) is equal or nearly equal to the square of $MM_1(N)$.

In the third approach, the first two moments of the impulse response and a third time constant called "T" are computed. The parameters of the two-time-constant approximation are then chosen to match these three time constants. The quantity $T_P$ is the "sum of the open-circuit time constants" of the linear circuit being approximated, and is computed as follows:

$$T_P = \sum_k R(k,k)C(k)$$

Again, the computation of $T_P$ can be generalized to the case where distributed RC elements are present.

The index k in the preceding summation ranges over all nodes of the tree. If however, there is more than one resistor or distributed RC element attached to a root node, (i.e. if more than one subtree branches out from a root node), a separate value of the parameter $T_P$ is computed for each such subtree, with the summation ranging over the nodes of that subtree.

A third solution method uses the following formulae:

$T_M = MM_1(N) - MM_2(N)/T_P$ $rtmp = 1 - 4 \; (T_M/T_P)$ (if $rtmp \leq 0$ use another method)

$rrsqrt = \sqrt{rtmp}$ $\tau_1 = 0.5 \; T_P \; (1 + rrsqrt)$ $\tau_2 = 0.5 \; T_P \; (1 - rrsqrt)$ (if $\tau_2 < 0$ use another method)

$A_1 = (MM_1(N) - \tau_2)/(\tau_1 - \tau_2)$

Using the above, a preferred method for determining the parameters of the reduced driver circuit in the first sub-step of the first step comprises the following steps:

(i) For each node N of the load circuit, compute the quantities $MM_1(N)$, $MM_2(N)$, using the same formulas that were used above in the Three Moment Matching method. (ii) Compute the following "moment-weighted capacitances" of the load circuit:

$$K_0 = \sum_k C(k)$$

$$K_1 = \sum_k MM_1(k)C(k)$$

$$K_2 = \sum_k MM_2(k)C(k)$$

where the index k of each summation ranges over all nodes of the load circuit. The above formulae are valid if there are no distributed RC elements in the load circuit, and can be generalized to the case where distributed RC elements are present.

Finally, $C_2$, $R_2$ and $C_1$ are determined by the equations:

$C_2 = K_1^2/K_2$ $R_2 = K_2^2/K_1^3$ $C_1 = K_0 - C_2$

The second sub-step of the second step comprises obtaining an explicit analytic solution for the response of the two-time-constant system when the root node is driven by the forced root-node waveform. In practice, the analytic solution is the sum of exponentials (one for each time constant) plus other terms that depend on the forced root-node waveform. Also in practice, the coefficients of the exponentials and the other terms differ for each piecewise region of an input waveform; therefore, coefficients of the various terms of the solution must be computed, as by the following formulas, for each piecewise input interval. The formulas may, of course, vary depending on the form of the forced root-node waveform—that is, the number of segments and the analytic form (linear, exponential, and so forth) of each segment.

As an example, the following formulae could be used for the analytic solution of the above-described forced root-node waveform having three segments:

Segment 1: linear from $(0,0)$ to $(T_1,V_1)$
Segment 2: linear from $(T_1,V_1)$ to $(T_2,V_2)$
Segment 3: exponential from $(T_1, V_2)$, and asymptotically approaches voltage 1 with time constant $\tau$.

The target node being considered is assumed to have step response:

$$V(t)=1-A_1 e^{-t/\tau_1}-(1-A_1) e^{-t/\tau_2}$$

with parameters $\tau_1$, $\tau_2$, and $A_1$, the values of which were determined in the first sub-step of the second step.

Using standard mathematical techniques such as convolution and superposition, an analytic solution for the response of the target node "N" to the forced root-node waveform is as follows:

For $0 \leq t \leq T_1$:

$$V(t)=C_1+M_1 t+B_{11} e^{-t/\tau_1}+B_{12} e^{-t/\tau_2}.$$

where the coefficients are computed as follows:
$A_2=1-A_1$
$M_1=V_1/T_1$
$C_1=-M_1 \, MM_1(N)$
$B_{11}=M_1 \, \tau_1 \, A_1$
$B_{12}=M_1 \, \tau_2 \, A_2$ For $T_1 \leq t \leq T_2$:

$$V(t)=C_2+M_2 t'+B_{21} e^{-t'/\tau_1}+B_{22} e^{-t'/\tau_2}$$

where $t'=t-T_1$ and the coefficients are computed as follows:
$D_{11}=B_{11} e^{-T_1/\tau_1}$
$D_{12}=B_{12} e^{-T_1/\tau_2}$
$B_{21res}=D_{11}-B_{11}$
$B_{22res}=D_{12}-B_{12}$
$M_2=(V_2-V_1)/(T_2-T_1)$
$B_{21new}=M_2 \, \tau_1 \, A_1$
$B_{22new}=M_2 \, \tau_2 \, A_2$
$C_2=-M_2 \, MM_1(N)+V_1$
$B_{21}=B_{21new}+B_{21res}$
$B_{22}=B_{22new}+B_{22res}$ For $t>T_2$:

$$V(t)=1-B_{30} e^{-t'/\tau_0}-B_{31} e^{-t'/\tau_1}-B_{32} e^{-t'/\tau_2}$$

where $t'=t-T_2$ and the coefficients are computed as follows:
$D_{21}=B_{21} e^{-(T_2-T_1)/\tau_1}$
$D_{22}=B_{22} e^{-(T_2-T_1)/\tau_2}$
$B_{31res}=D_{21}-B_{21new}$
$B_{32res}=D_{22}-B_{22new}$
$\tau_0=\tau$
$W_2=1-V_2$ (if $\tau_0=\tau_1$ or $\tau_0=\tau_2$, see comment below)
$B_{31}=W_2 \, \tau_1 \, A_1/(\tau_1-\tau_0)-B_{31res}$
$B_{32}=W_2 \, \tau_2 \, A_2/(\tau_2-\tau_0)-B_{32res}$
$B_{30}=-W_2 \, \tau_0 \, [A_1/(\tau_1-\tau_0)+A_2/(\tau_2-\tau_0)]$ In the foregoing, a different form of solution is required if $\tau_0=\tau_1$ or $\tau_0=\tau_2$ in order to avoid division by zero. In a preferred implementation, a small amount (e.g., 0.0001 ps) is added to $\tau_0$ in order to make it different from both $\tau_1$ and $\tau_2$.

At the conclusion of the second sub-step, the estimate of the waveform for the target node is available in the form of analytic formulas, such as those exemplified above. The third sub-step of this (second) step is to extract from these analytic formulas information which is useful for delay modelling. Depending on the needs of the designer and the requirements of the overall system of simulation and modelling, various forms of information can be extracted from the analytic formulas. For example, the voltage waveform of the target node can be plotted graphically for visual examination; or the time at which the waveform reaches one or more particular voltage levels may be computed; or the slope of the waveform at one or more points in time may be computed. All of these tasks can be readily accomplished using standard techniques.

The second step will now be illustrated by a numerical example using the circuit of FIG. 6 and the Three-Moment Matching Method to compute the delay estimate for one target node. The values computed for $MM_1$, $MM_2$, $MM_3$ for all tree nodes are listed below. For this example, ohms and picofarads are used as the units of resistance and capacitance respectively, so that the units for $MM_1$, $MM_2$ and $MM_3$ are, respectively, picoseconds, picoseconds squared, and picoseconds cubed.

$MM_1(1)=0$
$MM_2(1)=0$
$MM_3(1)=0$
$MM_1(2)=190.00$
$MM_2(2)=67100.00$
$MM_3(2)=27475000.00$
$MM_1(3)=410.00$
$MM_2(3)=170900.00$
$MM_3(3)=71689000.00$
$MM_1(4)=490.00$
$MM_2(4)=210100.00$
$MM_3(4)=88497000.00$
$MM_1(5)=430.00$
$MM_2(5)=179500.00$
$MM_3(5)=75279000.00$

A delay estimate for node 2 of the circuit of FIG. 6 will now be determined for a target voltage of 0.65. The three-moment matching method gives the following step response for this node:

$$V(t)=1-A_1 e^{(-t/\tau_1)}-(1-A_1)e^{(-t/\tau_2)}$$

with the following parameter values:
$\tau_1=419.883$
$\tau_2=55.149$
$A_1=0.369724$ Recall from the illustration of Step 1 (FIG. 5) that the forced root-node waveform has the following parameters (time units are in picoseconds):
$T_1=544$
$V_1=0.3165$
$T_2=1564$
$V_2=0.6$
$\tau=1512.9$ The equations of the second sub-step of the second step provide the following information:

For the first segment $0 \leq t \leq T_1$:

$$V(t)=C_1+M_1\,t+B_{11}\,e^{-t/\tau_1}+B_{12}\,e^{-t/\tau_2}.$$

$A_2=0.630276$
$B_{11}=0.0902767$
$B_{12}=0.0202133$
$C_1=-0.11049$
$M_1=+0.581526\text{E-}03$ At the end of the first segment (time $T_1$) the analytic solution has reached the value 0.23068.

For the second segment $T_1 \leq t \leq T_2$, $$V(t)=C_2+M_2\,t'+B_{21}e^{(-t'/\tau_1)}+B_{22}\,e^{(-t'/\tau_2)}$$

$t'=t-T_1$
$B_{21res}=-0.065577$
$B_{22res}=-0.0202123$
$B_{21}=-0.0224294$
$B_{22}=-0.0105514$
$C_2=+0.263662$
$M_2=+0.27794\text{ E-}03$ At the end of the second segment (time $T_2$) the analytic solution has reached a voltage of 0.54522.

For the third segment $t>T_2$:

$$V(t)=1-B_{30}\,e^{-t/\tau_0}-B_{31}\,e^{-t/\tau_1}-B_{32}\,e^{-t/\tau_2}$$

where:
$t'=t-T_2$
$B_{31res}=-0.0451232$
$B_{32res}=-0.966093\text{ E-}02$
$B_{30}=+0.466349$
$B_{31}=-0.0116878$
$B_{32}=+0.123318\text{ E-}03$ The target voltage (0.65 volts) is reached during the third segment. Solving the above exponential equation, the target voltage is reached at time 1979.9 ps.

The preferred embodiment includes a number of additional improvements upon the above-described method. One such improvement is the use of "delta delays". For a given network, one can first compute the "lumped delay", (i.e., the delay which would be produced if the entire capacitance of the network were placed on the root node and no resistors or other nodes were present), for each target voltage using the above method. The "delta delay" for each target node and voltage is then computed by subtracting this lumped delay from the delay predicted for that node and voltage, which has been computed by the above method. The delta delay is then passed on to another program (such as a logic simulator) which has another, usually more accurate, method for estimating lumped delay, and which adds the delta delay to its own estimate of the lumped delay to get the overall delay estimate. In this way, an overall delay estimate is obtained which is better than could be produced by the above method or the other program alone.

Another improvement included in the preferred embodiment is the use of "propagation delay". The above described method assumes that the delay of a driving device driving a capacitive load with no resistance is directly proportional to the load capacitance. The delay is measured from the time the driving device turns on, which by assumption occurs instantaneously at time 0. This assumption can be replaced by the assumption that the delay of a driving device with a capacitive load is the sum of a fixed "propagation delay", depending just on the calibration ensemble, and a term which is directly proportional to the capacitance. Then, for each calibration ensemble, a propagation delay is determined during calibration, using a standard data-fitting technique. The propagation delay is then subtracted from each delay produced during calibration, so that the delays in the look-up tables reflect just the part of the delay that is load-dependent. Finally, after delays have been computed according to the above inventive method, the propagation delay is added to each delay so produced to obtain the final delay estimate. The delays obtained in this way are more accurate than those which would be obtained without the use of propagation delay.

In practice, part of the capacitance of a root node is due to non-linear capacitance of the driving device, and the above-mentioned data-fitting process can be extended to find "best-fit" values for the capacitance of each driving device for inclusion in the root-node capacitance of the RC network.

Another improvement concerns the treatment of RC nets that have more than one driving node. The drivers of such nets are usually "three-state devices"—devices that can not only output a 0 or a 1, but can also be turned completely off. When a driver is turned off, it functions in the RC net as an ordinary non-driver capacitive node. In the operation of the circuit, a typical use for such nets is to have only one driver driving at a time, while all other drivers are turned off. In that case, the net at any time has a unique driving node, such that the above-described method can be used to predict delays.

But it is also possible to have more than one driver driving at the same time. A preferred, exemplary way to handle this situation is to use the present inventive method to compute delays for each driver driving alone, and take as the predicted delay for each target node the minimum of the delays for that target node, over all active drivers. The delay estimates produced in this way overestimate the actual delay.

The foregoing represents preferred methods for implementing the present invention. It should be recognized, however, that the foregoing implementations of the inventive method are intended to be illustrative only and that the inventive method can be implemented in other forms.

One possible variation is to use higher dimensional look-up tables in order to accommodate a more complex reduced circuit having additional reduced circuit parameters, thereby improving accuracy. Such a variation would incur significant cost in terms of the size of the look-up tables and the computer time required for calibration. Accordingly, a determination must be made on a case-by-case basis as to whether the additional accuracy is justified. For example, if lumped delay models are relied upon for overall delay prediction, and if the accuracy of the method as implemented in predicting delta delays exceeds the accuracy of these models by an adequate margin, then the expansion of the look-up tables would likely not be justified.

Another possible variation is to improve the accuracy of the second step by replacing the two-time-constant approximation by a 3-time-constant approximation, in which the step response of the target node is represented by an expression of the form:

$$V(t)=1-A_1e^{(-t/\tau_1)}-A_2\,e^{(-t/\tau_2)}-A_3e^{(-t/\tau_3)}$$

with parameters $\tau_1$, $\tau_2$, $\tau_3$, $A_1$ and $A_2$. (The coefficient $A_3$ must equal $1-A_1-A_2$.)

Once values have been chosen for the parameters, the mathematics of this generalization are entirely straightforward. Equations analogous to those described with respect to the second sub-step of the second step can then be solved as before.

One approach for choosing the values for the parameters is to match higher moments of the impulse response: since the number of parameters has increased from 3 to 5, one can try to match the first five moments of the impulse response. However, the amount of computation needed to compute moments increases significantly; the equations that need to be solved to determine the parameters are much more complex and there is no guarantee that all moments can be matched.

In the first step, the calibration was described as being done with scaled circuits having fixed drive strength $X_0$ and fixed root-node capacitance $C_0$. Variations on this idea are possible. For example, one could calibrate with scaled circuits having a fixed capacitance $C_0=C_2'$ on the non-root node, producing look-up tables as a function of $C_1'$ and $R_2'$.

Thus, only one look-up entry is needed for each value of the ratio $C_2/C_1$ of reduced circuit capacitances, and for each value of the ratio of reduced circuit $R_2$ to reduced circuit driver impedance (or, equivalently, the product of $R_2$ with driver strength). For further improving accuracy, circuit simulation of a number of circuits having the same value for these ratios could be performed for each table data point. The resulting delay numbers (after appropriate scaling), could then be combined by, for example, averaging into a single "best-estimate" number.

It should also be noted that the numbers stored in the look-up tables are not necessarily delays. For example, the look-up table could provide an exponential time constant describing the exponential "tail" of the waveform. Like actual delays, such time constants could be interpolated to get values other than those stored in the table. In general, the numbers stored in the look-up table may be actual delays, or parameters of the waveform from which delays can readily be computed or estimated.

One exemplary application of the present invention would be to use the analytic waveforms produced in the second step as initial solutions for a waveform relaxation method of simulation.

Another use of the inventive method would be the prediction of waveform slopes for logic simulation with slope modeling. The slope of the waveform can be readily obtained from the analytic solution of the second step. The slope can be used as an input to macro-models which compute delays as a function of input waveform slope.

Further, a delay obtained from look-up tables in accordance with the first step of the inventive method could be used to compute an equivalent resistance for the driver. This resistance could then be plugged into any RC-tree delay estimation method.

It will be appreciated by those of ordinary skill in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein. For example, although the preceding described a method for determining signal delays of integrated circuits, particularly CMOS integrated circuits, it should be appreciated that the method is not limited to the macro-modeling environment nor to CMOS integrated circuit designs. The method can also be applied, for example, to transistor-level simulations, where the "driving device" is a transistor or collection of transistors. Moreover, the method can be applied to analog and quasi-analog simulations as well as digital simulations.

What is claimed is:

1. For an original circuit having an original driving device connected to an original driving node and another node connected to said original driving node through an impedance network, a method of determining an approximate delay time after said original driving device is turned on at which a voltage at said another node reaches a predetermined value, comprising the steps of:

for a substitute circuit having a substitute driving device connected to a substitute driving node and specified by a predetermined set of parameters, determining for a multiplicity of different sets of values of said predetermined set of parameters, using a computer simulator, voltage waveforms expected at said substitute driving node in response to said substitute driving device being turned on, and retrievably storing discrete-time representations of said voltage waveforms;

determining a set of values of said predetermined set of parameters for which delay characteristics of said substitute circuit approximate delay characteristics of said original circuit, and from said discrete-time representations of said voltage waveforms, determining a voltage waveform corresponding to said set of values;

scaling said voltage waveform such that a resulting scaled voltage waveform approximates a voltage waveform expected at said original driving node of said original driving circuit in response to said original driving device being turned on;

determining an approximate analytical expression for said scaled voltage waveform; and predicting said approximate delay time of said original circuit using said approximate analytical expression.

2. The method according to claim 1 wherein the impedence network is an RC network.

3. The method according to claim 2 wherein the RC network includes a plurality of nodes joined by at least one of linear resistors and distributed resistor and capacitor elements.

4. The method according to claim 1 wherein said original driving node is a macro-cell output pin and said another node is a macro-cell input pin.

5. The method according to claim 1 wherein the substitute circuit includes a linear resistance, a substitute driving node capacitance and an output node capacitance, and said predetermined set of parameters includes the values of the linear resistance, substitute driving node capacitance and output node capacitance.

6. The method according to claim 1 wherein the set of values of the predetermined set of parameters is determined by computing several electrical parameters of the network, and selecting the set of values so that the electrical parameters match the corresponding electrical parameters of the substitute circuit.

7. The method according to claim 6 wherein the impedance network is an RC network and the electrical parameters comprise a predetermined number of moment-weighted capacitances.

8. The method according to claim 7 wherein the number of the moment-weighted capacitances is three.

9. The method according to claim 8 wherein the output node capacitance of the substitute circuit, comprising the substitute driving node and an output node connected by a linear resistor, equals the square of the first-order moment-weighted capacitance divided by the second-order moment-weighted capacitance, the linear resistance of the substitute circuit equals the square of the second-order moment-weighted capacitance divided by the cube of the first-order moment-weighted capacitance, and the substitute driving node capacitance equals the zero-order moment-weighted capacitance minus the output node capacitance of the substitute circuit.

10. The method according to claim 1 wherein the step of determining an approximate analytical expression for the scaled voltage waveform produces a piecewise description of the scaled voltage waveform, wherein each piece spans some specified time interval and is described in terms of an analytic function.

11. The method according to claim 10 wherein the analytic function comprises at least one of a straight line, a simple exponential, and a polynomial.

12. The method according to claim 1 wherein the step of using the analytical expression to predict said delay time further includes determining the response of said another node to the scaled voltage waveform using a linear system solution.

13. The method according to claim 12 wherein the step of determining a response includes: approximating said another node as a linear system having a number of time constants and associated parameters; and determining a response of this linear system to the scaled voltage waveform.

14. The method according to claim 13 wherein the number of time constants is at least two.

15. The method according to claim 14 wherein the step of approximating further includes choosing the time constants and associated parameters to fit said another node.

16. The method according to claim 15 wherein the step of choosing includes computing several significant time constants of the original circuit, and selecting time constants and parameters for said another node based on the several computed time constants.

17. The method according to claim 16 wherein the step of choosing includes determining several significant time constants by computing a predetermined number of impulse response moments for said another node and choosing the time constants and associated parameters for said another node to provide moments which correspond to the impulse response moments.

18. The method according to claim 17 wherein the predetermined number of computed impulse response moments is at least two.

19. The method according to claim 17 wherein the number of impulse response moments is three, and the step of choosing includes the step of calculating the time constants for said another node by solving a quadratic equation.

20. The method according to claim 1 wherein the discrete time representations of said voltage waveforms are stored by constructing look-up tables using the results of the value determining step.

21. The method according to claim 20 wherein determining a voltage waveform corresponding to said set of values of said predetermined set of parameters includes the step of accessing a number of values from one or more look-up tables.

22. The method according to claim 21 wherein determining a voltage waveform corresponding to said set of values of said predetermined set of parameters includes the step of selecting a number of values from the look-up tables and interpolating between the selected values.

23. The method according to claim 22 wherein the values accessed from the look-up tables include values representing delays.

24. The method according to claim 22 wherein the substitute driving device belongs to a family of driving devices that can each be characterized by a real-number driver strength which indicates the speed with which the substitute driving device can drive a given capacitive load.

* * * * *